United States Patent [19]

Conroy et al.

[11] Patent Number: 4,985,107
[45] Date of Patent: Jan. 15, 1991

[54] COMPONENT LOCATION DEVICE AND METHOD FOR SURFACE-MOUNT PRINTED CIRCUIT BOARDS

[75] Inventors: Walter J. Conroy, Saratoga; William Katona, Santa Clara, both of Calif.

[73] Assignee: SCI Systems, Inc., Huntsville, Ala.

[21] Appl. No.: 162,427

[22] Filed: Mar. 1, 1988

[51] Int. Cl.$^5$ .............................................. B32B 1/00
[52] U.S. Cl. ..................................... 156/299; 29/740; 118/504; 156/556; 228/6.2
[58] Field of Search ...................... 156/556, 297, 299; 228/6.2, 180.2; 29/740; 437/209, 217; 118/504, 505

[56] References Cited

U.S. PATENT DOCUMENTS

| | | | |
|---|---|---|---|
| 3,355,078 | 11/1967 | Smith | 223/44 |
| 3,516,155 | 6/1970 | Smith | 228/180.2 X |
| 3,859,723 | 1/1975 | Hamer et al. | 29/740 X |
| 3,970,934 | 7/1976 | Aksu | 324/158 F |
| 4,099,120 | 7/1978 | Aksu | 324/158 P |
| 4,159,176 | 6/1979 | De Masi | 355/79 |
| 4,292,116 | 9/1981 | Takahashi et al. | 156/297 X |
| 4,357,575 | 11/1982 | Uren | 324/158 F |
| 4,410,928 | 10/1983 | Aramaki | 361/400 |
| 4,479,298 | 10/1984 | Hug | 228/6.2 X |
| 4,512,509 | 4/1985 | Ellis et al. | 228/180.2 |
| 4,548,667 | 10/1985 | Wical | 156/556 X |
| 4,595,794 | 6/1986 | Wasserman | 174/138 |
| 4,722,135 | 2/1988 | Read | 29/740 |

FOREIGN PATENT DOCUMENTS 2063227 6/1981 United Kingdom ................. 29/834

Primary Examiner—David A. Simmons
Attorney, Agent, or Firm—Curtis, Morris & Safford

[57] ABSTRACT

Electrical circuit components such as integrated circuit chips with plural closely-spaced mounting feet/terminals are mounted on surface-mount connection pads on a printed circuit board very simply and easily by mechanical means. An alignment pattern member having very precisely located holes matching the array of pads on the printed circuit board is used. The feet of the component first are fitted into the holes in the pattern to orient and locate them accurately, then the pattern and the component are separated from one another, and the component is placed with the feet on the pads. Preferably, the component is picked up with a vacuum pick-up device to remove it from the pattern, an is lowered onto the pads of the circuit board by the same mechanism. In an alternate embodiment, the printed circuit board and the pattern are secured to a sliding table which removes the pattern from beneath the vacuum pick-up device and moves a printed circuit board into position underneath the vacuum pick-up devices, which then lower the components onto the pads. Advantageously, the pattern member is made with a stencil used to apply solder paste to the pads.

27 Claims, 5 Drawing Sheets

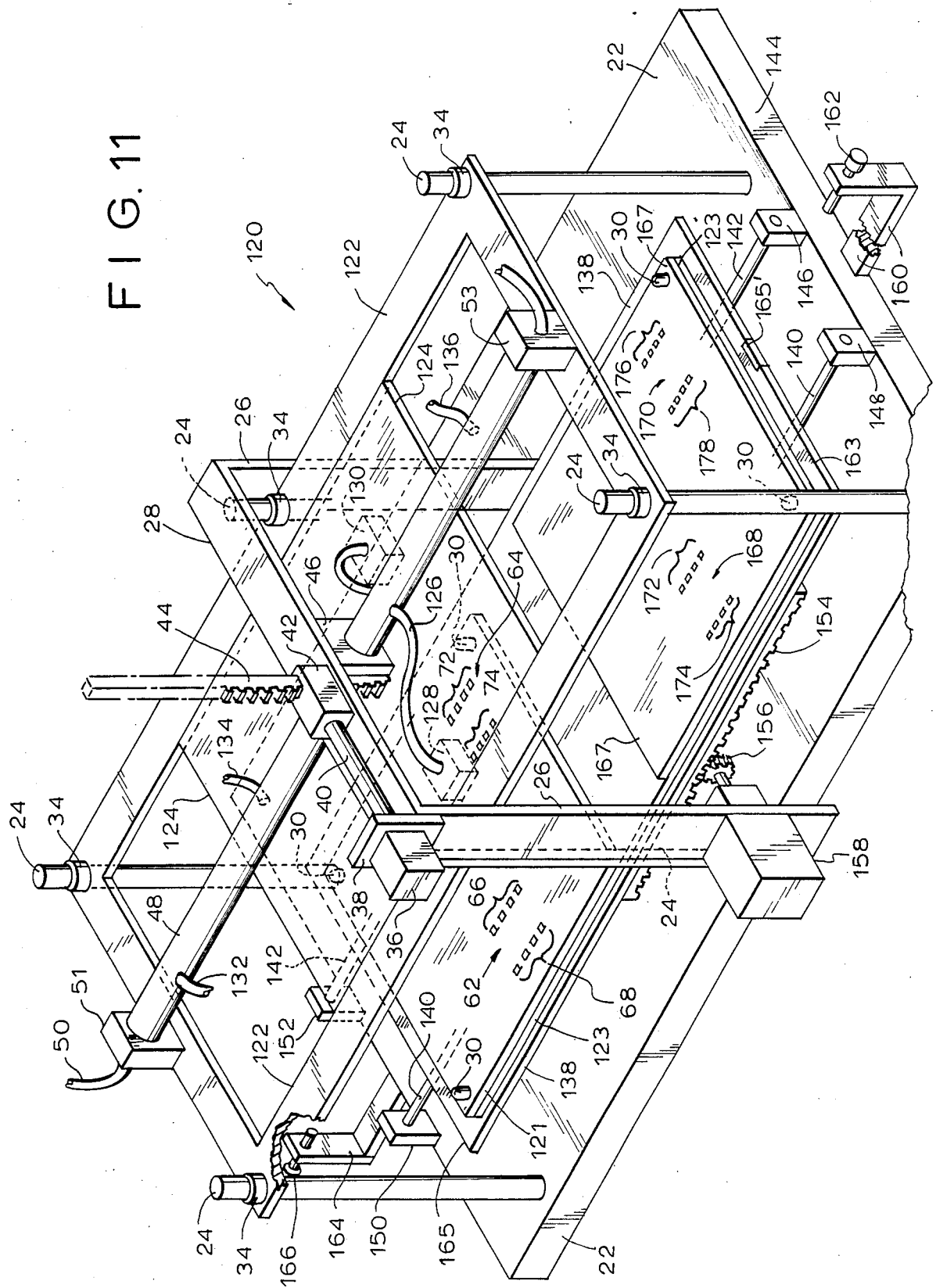

COMPONENT LOCATION DEVICE AND METHOD FOR SURFACE-MOUNT PRINTED CIRCUIT BOARDS

This invention relates to surface-mount printed circuit board technology, and particularly to devices and methods for accurately locating high pin count, high density leaded electrical circuit components when mounting them on the circuit boards.

Surface-mount printed circuit boards are characterized by the fact that all or part of the circuit board circuitry and component mounting structures are formed without holes through the board. Thus, board real estate is saved due to eliminating the through holes. Smaller circuit package sizes and hole elimination provides a significant reduction in the size of the board required to form a given circuit or provides an opportunity to package more functionality and performance on a given board size. However, surface-mount technology usually requires considerably greater accuracy in the location of the printed conductors and components on the boards because they typically are placed on small pads or footprints with leads very close to one another.

Typically, the electrical leads of the circuit components board are used to mount the components on the board. Often components such as integrated circuit chips and the like have "gull"-shaped leads with flat pads or "feet" at the ends of the leads. Other lead shapes used include "J"-shaped leads whose "feet" are located at the bottom of the "J" structure and are folded under the package. These feet are soldered to flat electrically conductive surface "pads" on the board surface in order to mount the component on the board and to connect it to the circuitry of the board.

In the usual surface-mount manufacturing procedures, the electrical conductors and mounting pads are formed on the surface of the board by known photo-etching techniques. Then, there is applied to each of the mounting pads a small quantity of solder paste which is a paste including solder, solder flux, and other materials such as uncured epoxy resin. Then the feet on the leads of the circuit components are placed on the paste. The paste acts as an adhesive and holds the components in place. Then, after all of the components have been so mounted, the board is conveyed through an oven or other heating means to heat the solder paste to an appropriate temperature to melt the solder in the paste and solder the feet to the pads.

Equipment typically used to accurately locate the components on the pads has vacuum pick-up heads or mechanical jaws which pick up the components, orient them, and then move the components, under the control of a computer and numerical control software, to the proper location, where the components are set down with the feet contacting the pads.

The most modern surface-mount technology often requires circuit components such as integrated circuit chips to have electrical leads or feet which are spaced very close to one another. For example, in some such devices, adjacent feet are only 8 mils. (8 thousandths of an inch) apart.

The typical vacuum pick-up heads used to pick up the integrated circuit chips and locate them use the square ceramic or plastic case of such devices to align the case in the proper orientation. These devices have center to center lead spacing of 0.0315, 0.025, 0.020 and less of varying lead or pin counts from 20 to over 200. This creates a problem which it is an object of the present invention to solve. The problem is that the terminals or feet/leads of the chip are not located with respect to the square or rectangular plastic packaging outline of the chip with an accuracy sufficient to enable the vacuum pick-up or placement devices to utilize the square case for orienting the part and aligning the feet with the pads with sufficient accuracy. As a result, it sometimes has been necessary to correct the placement of the part on the circuit board by hand, using microscopes to check the alignment. Such realignment often results in smearing of the solder paste and creates "short circuits" between leads. The result is that circuit board requires rework and potential circuit and board damage exists. Thus, the yields in manufacturing electronic assemblies are well below desired levels, and overall manufacturing costs are excessive.

In an effort to solve this problem in the past, complex optical alignment machines have been designed and built. However, such machines are very expensive, a fact which does little, if anything, to reduce manufacturing costs, and actually may increase them unless very high volume manufacturing opportunities exist.

Accordingly, it is an object of the present invention to provide an accurate, relatively simple and inexpensive device and method for mounting electrical circuit components on surface-mount boards with a high degree of accuracy. Moreover, it is an object of the invention to provide such a device and method which mounts such circuit devices accurately with a relatively high degree of repeatability and reliability so as to maximize yields of high quality surface-mount printed circuit boards.

In accordance with the present invention, the foregoing objectives are met by the provision of a device and method in which feet or leads of the circuit components are inserted into at least one, and preferably a plurality of very accurately located holes in a pattern member. The pattern member is accurately located and oriented with respect to the pads on the printed circuit board, and the alignment of the component thus achieved is used in accurately mounting the feet of the component in contact with the pads on the circuit board. This avoids the use of the plastic case or housing of the component for orientation of the component and thus avoids the use of its inconsistent dimensions and the resulting poor orientation and manual alignment requirements.

A plurality of holes are provided in the pattern member, one for each foot of the component legs. In one preferred embodiment of the invention, the pattern member which is used is the accurately-formed stencil or screen which is used to apply the solder paste to the pads on the circuit board, or is a duplicate thereof. The photographic artwork which is used to form the circuitry and pads during the printed circuit board manufacture board also is used to form the stencil or screen. Thus, the pattern member used to align or orient the component is formed by use of the same photographic artwork and printed circuit boards crosshairs or tooling as the pads, and the alignment of the feet with the pads is established with a high degree of accuracy.

In the preferred method, the pattern is located accurately with respect to the pads on the printed circuit board, the component feet are manually or automatically fed and fitted into the holes in the stencil pattern, and then the component is lifted away from the pattern by means of a simple vacuum pick-up device. Then the circuit board is moved into position beneath the pick-up device, and the pick-up device lowers the component onto the pads. Advantageously, the pick-up device moves only vertically, thus reducing the chances for error in locating the component.

Another alternative is the provision of a sliding table, with the pattern being accurately located on the table with respect to the printed circuit board, which also is mounted on the table. The table slides back and forth, first to position the pattern underneath the pick-up heads, and then to position the printed circuit board beneath the heads.

The vacuum pick-up devices securely hold the components and maintain their orientation while the printed circuit board is moved into place.

The result of the use of the invention is the location of circuit components on surface-mount printed circuit boards with great accuracy, and with a high degree of reliability and repeatability. The equipment used in this process is relatively much less expensive than the optical alignment equipment currently marketed and yet has all of the accuracy needed in order to maintain very close tolerances.

The foregoing and other objects and advantages of the invention will be set forth in or apparent from the following description and drawings:

IN THE DRAWINGS

FIG. 11 is a perspective view illustrating another device constructed in accordance with the present invention.

SINGLE-STATION EMBODIMENT

Figure 1:
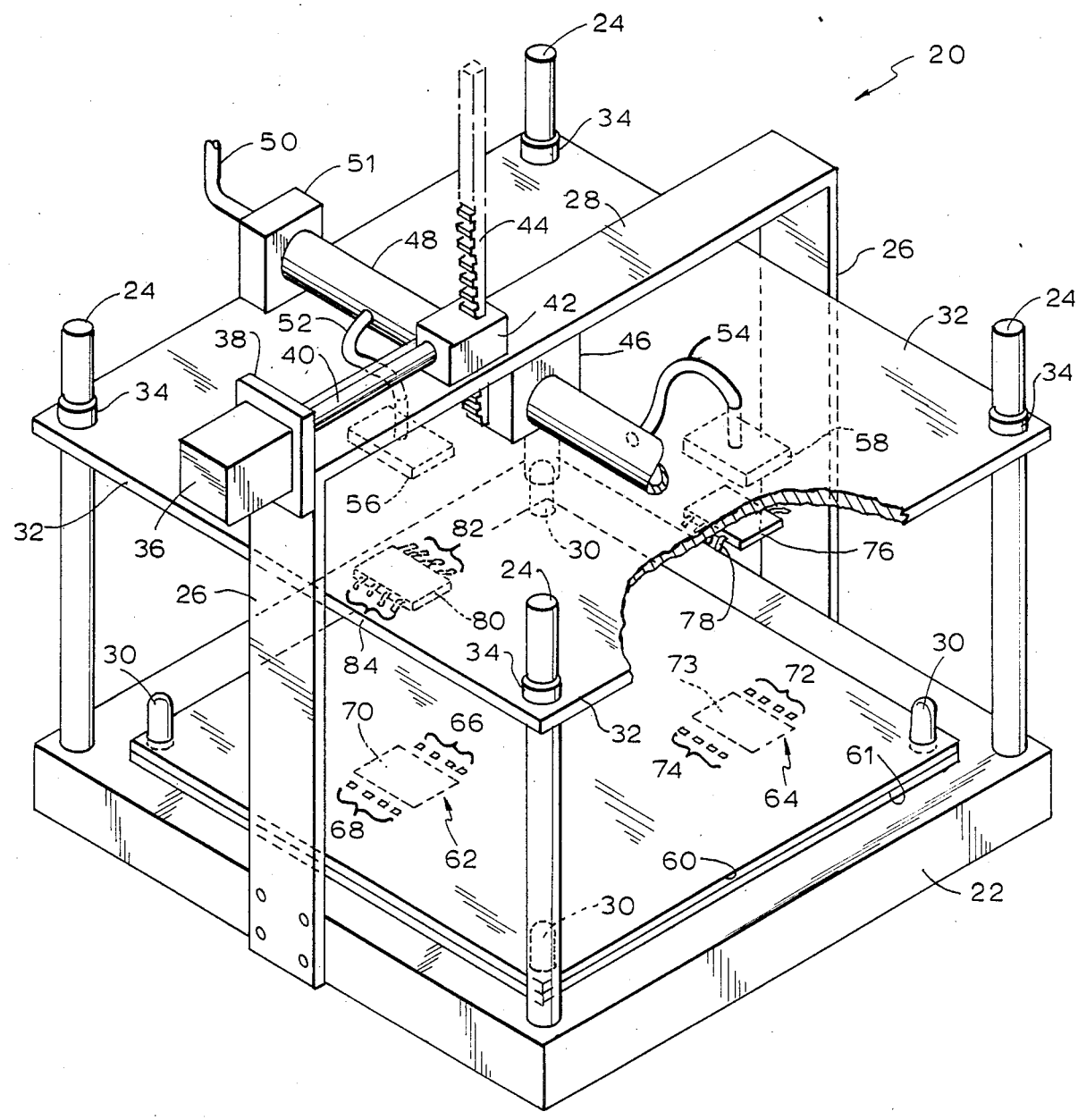
FIG. 1 is a perspective, partially broken-away and partially schematic view of a device constructed in accordance with the present invention and employs the sliding table concept.

FIG. 1 illustrates a relatively simple single-station device 20 for mounting electrical circuit components such as the integrated circuit chips 76 and 80 on a surface-mount printed circuit board. The board itself is not shown in FIG. 1.

The device 20 includes a flat metal base plate 22 with four upright vertical posts or rods 24 extending upwardly from the upper surface of the base. A lifting frame is formed of two vertical members 26 with a cross-bar 28 joining the upper ends of the vertical members. The vertical members 26 are secured at their lower ends to the sides of the base member 22.

Four accurately located pins 30 extend upwardly from the surface of the base member 22. A vacuum pick-up head mounting plate 32 is mounted by means of precision ball bearings 34 to slide up and down on the vertical posts 24. A servo motor 36 is mounted on a mounting plate 38 secured to one of the vertical members 26 and rotates a shaft 40 to drive gearing 42 to drive a vertical rack element 44 which is secured to a mounting member 46. The mounting member 46 is secured to a vacuum header conduit 48 which is secured to the plate 32 by means of mounting blocks 51 at its two ends (one of the blocks 51 is not shown in FIG. 1, for the sake of clarity in the drawings).

Thus, the servo motor 36 causes the plate 32 to move upwardly and downwardly on the vertical guide rods 24. A pipe or tube 50 connects the interior of the vacuum header 48 to a vacuum pump and resonator (eliminates, filters vacuum source) (not shown). Flexible tubes 52 and 54 apply the vacuum to vacuum pick-up heads 56 and 58, which are secured to the plate 32 in predetermined locations based on the placement locations of the specific assembly requirements. There is one such vacuum pick-up head for every high pin-count, precise circuit component to be mounted on the circuit board. Thus, the number of flexible tubes such as 52 and 54 and the pick-up heads 56 and 58 will vary depending upon the number of such circuit components to be mounted.

Located on the flat upper surface of the mounting plate 22 is a pattern member 60 secured to a steel backing plate 61. The pattern member 60 preferably is solder paste application stencil. The stencil comprises a thin sheet of brass, with two arrays 62 and 64 of square holes. These holes are indicated by the reference numerals 66, 68, 72, and 74. The dashed lines 70 and 73 indicate the location of the body of an integrated circuit chip such as chips 76 and 80 relative to the holes in the pattern member 60. The stencil sheet actually is a thin, chemically etchable brass substrate and is not nearly as thick as the backing plate 61, but is shown as being relatively thick, for the sake of clarity in the drawings.

The integrated circuit chip 76 has "gull wing" type leads 78 with flat feet. The chip 76 is shown in a position immediately above the array 64. Similarly, a second integrated circuit chip 80 has leads 82 and 84, and is shown immediately above the array 62. The chip 76 is shown in a location immediately below the vacuum pick-up head 58 which picks it up, and the chip 80 is shown immediately below the vacuum head 56 which picks it up.

The spacing and relative location of the holes in the arrays 62 and 64 match, respectively, the locations of the feet on the chips 80 and 76, and also match the location and shape of mounting pads on a printed circuit board (not shown in FIG. 1) onto which the components 76 and 80 are to be mounted. The pattern member 60 and the plate 61 each have four accurately located tooling holes into which the locating pins 30 fit so as to locate the pattern member and its supporting plate accurately onto the base plate 22.

In accordance with the present invention, the circuit components are mounted accurately by the following procedure:

First, the integrated circuit components 76 and 80 are positioned by hand or automatically with vibration feeders/locators with the feet on their leads 78, 82, 84, etc. in the holes 72 and 74 or 66 and 68, respectively. The feet are dimensioned so as to fit into the holes in the pattern member with close tolerances. If necessary, the component can be moved or vibrated slightly in order to ensure that the feet slip into the holes. The bottoms of the feet rest on the top surface of the backing plate 61.

Next, the motor 36 is actuated to lower the table 32 so that the vacuum pick-up heads 56 and 58 contact the cases of the components 80 and 76, respectively, and a vacuum is supplied to the line 50 to attach the components to the pick-up heads.

Next, the placement of the device is automatically detected and the direction of the motor 36 is reversed and the plate 32 and the pick-up heads 56 and 58 and the components are lifted upwardly. The vacuum is maintained all the while so that the components 76 and 80 retain their exact placement orientation achieved by fitting the feet into the holes in the pattern member 60.

Then, the pattern member 60 and the plate 61 are lifted off of the pins 30, and a surface-mount printed circuit board with four mounting holes matching the location of the pins 30 is lowered onto the pins 30. The printed circuit board has pads at precisely the same locations, relative to the pins 30, as the holes in the arrays 62 and 64 and at this time has solder paste applied on each pad.

Next, the motor 36 again is actuated to lower the plate 32 until the feet on the components 76 and 80 contact the paste-coated mounting pads on the circuit board.

Then, the placement completion is automatically sensed and the vacuum on the line 50 is removed so that parts 76 and 80 are released from the grips of the vacuum heads, and the plate 32 is again lifted. A combination of paste grip and gravity secures the component in the desired location. The circuit board is removed from the pins 30, and the procedure is repeated for subsequent circuit boards.

In accordance with one advantageous feature of the present invention, the pattern member 60 which is used actually is a thin brass stencil plate which is used as a stencil in the application of solder paste to the pads on the printed circuit board. The stencil is used in order to ensure that solder paste is applied only to the pads and not to surrounding portions of the circuit board, since it is very deleterious to the functionality and quality of the circuit board to have solder paste in undesired locations. This stencil is formed from the same photographic artwork as that used to form the pads themselves. Therefore, the holes are very accurately located and dimensioned with respect to the pads.

The solder paste used can be one of a number of known formulations, for example, one which comprises a mixture of uncured epoxy resin and tiny balls of solder metal, together with solder flux.

The positions of the location holes in the pattern and printed circuit board, and the positions of the locating pins 30 on the base plate 22, all are determined with a high degree of accuracy by use of the same artwork as that used to form the circuits and pads.

The result of the operation of the device 20 and the method described above is at a location of circuit components with their feet very accurately aligned with the pads on which they are placed. This is performed with a high degree of accuracy (e.g., to within 0.002 inch) in a repeatable and reliable fashion and thus is very advantageous in increasing yields of the manufacturing process. Since the stencil is formed for other purposes as well, the making of one or more extra stencils for use in component location adds little cost and allows the preloading of cartridges in support of higher volume requirements.

Figure 2:
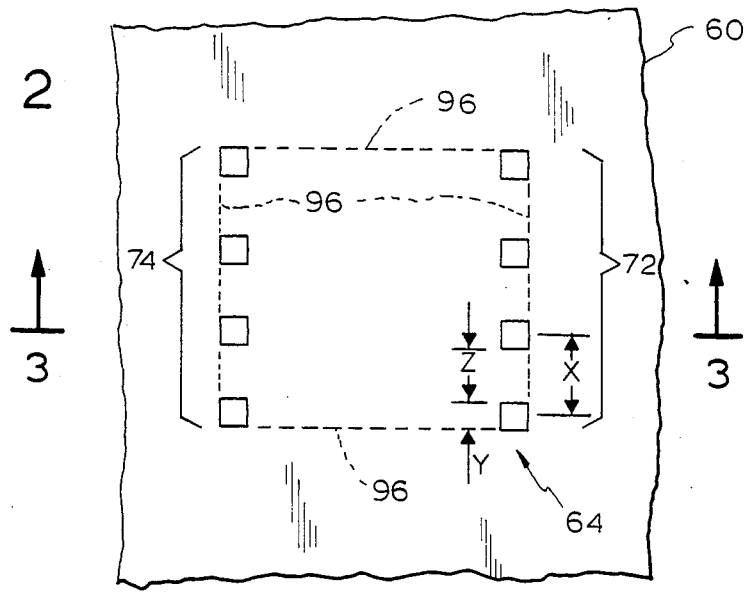
FIG. 2 is a top plan view of a portion of the pattern member of FIG. 1.

FIG. 2 is an enlarged plan view of the array 64 of holes 72 and 74 in the pattern member 60. Although only four holes are shown in each linear group, it should be understood that any number of holes can be provided, and one is required for each lead and foot pad of the component. Typically, most integrated circuit chips have more than the eight leads.

In a typical device with which the invention is used to such great advantage, the spacing "X" between the center lines of adjacent pads is approximately 20 mils (20 thousandths of an inch), the width "Y" of each pad is approximately 12 mils, and the spacing "Z" between adjacent pads is only 8 mils. Such close spacing and small size of the feet and pads creates a need for exceptional accuracy in location of the feet on the pads. This invention provides the accuracy with relatively simple and inexpensive equipment.

Figure 3:
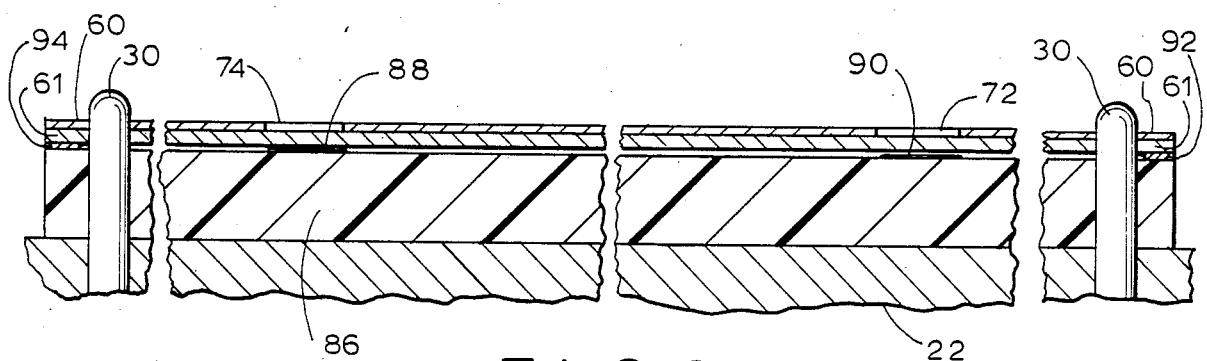
FIG. 3 is an enlarged, partially broken-away cross-sectional view taken along line 3—3 of FIG. 2, showing another embodiment of the invention.

FIG. 3 is a further enlarged, partially broken-away view showing the pattern member 60 secured to the plate 61 in use in a modification of the procedure described above. Instead of first mounting and then removing the pattern member 60 and plate 61, a printed circuit board 86 is mounted on the pins 30 first, and then the pattern 60 and plate 61 is mounted on the pins 30. Thin spacers 92 and 94 are secured at the four corners of the bottom of plate 61 to prevent the bottom of plate 61 from contacting the solder paste on the pads 88 and 90 on the circuit board 86. Then, the feet of the circuit components are inserted into the holes 72, 74, and are picked up by the pick-up heads 56 and 58. The pattern member 60 and plate 61 are then removed from the pins 30, and the components are lowered onto the pads.

It is preferred that the thickness of the backing plate 61 be equal to the thickness of the circuit board 86 so that, when the first of the above-described procedures is performed, the pick-up heads descend to the same elevation above the base plate 22 when placing the components on the pads 88, 90 as when the heads descend to pick up the components. This simplifies the programming of the motion of the pick-up heads and improved accuracy.

Figure 4:
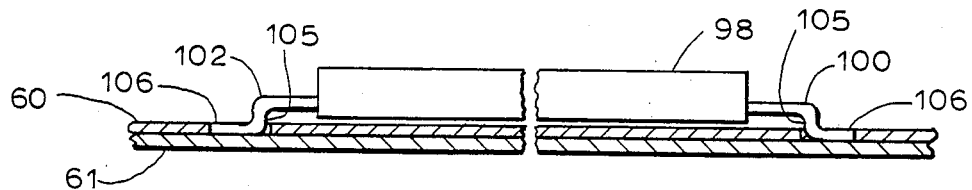
FIGS. 4 through 10 are cross-sectional, broken-away schematic views illustrating steps used in performing one embodiment of the method of the present invention.
Figure 5:
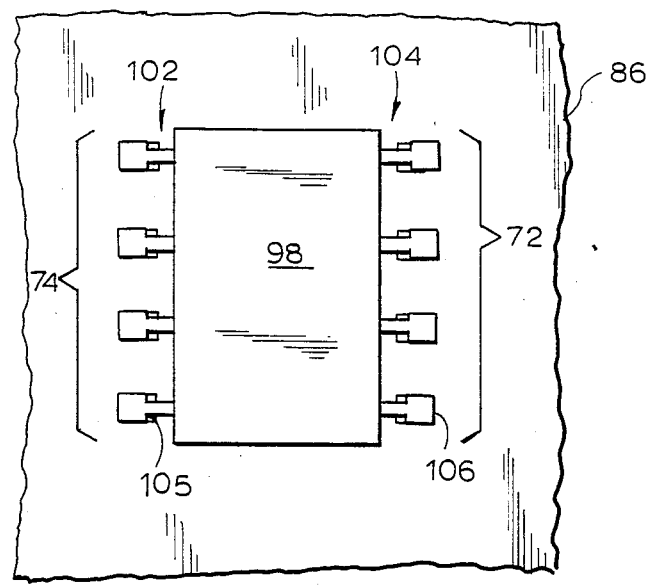

FIGS. 4 and 5 show an electrical circuit component 98 with gull-wing shaped leads 102 and 104 with square foot pads inserted into the holes in the pattern member 60. The edges 104 and 106, and the sides of the feet fit snugly into the holes. The spacing between the edges of the feet and the edges of the holes is of the order of 2 mils. Advantageously, this spacing results naturally from the photo-etching process which is used to form the stencil or screen used to apply solder paste to the pads. By use of the same artwork for the formation of the pads on the circuit board and the holes in the stencil, the high accuracy of the artwork is used for location of the components on the pads.

It should be understood, of course, that, whereas "positive" artwork may be used to expose the photo-resist material on the metal surface of the blank board so as to etch away unwanted metal around the pads and between the conductors, inverse artwork (e.g., a photographic "negative" which permits etching of only the pad areas) is used to form the stencil or screen.

The locating holes in the circuit boards and the stencils and the backing plate also are formed by use of the same precise photographic artwork. Such holes are formed with a high degree of accuracy by well-known techniques, and thus can be used to accurately align both the pattern member and the circuit board on the same locating pins. This assures that the mounting feet of the circuit components will be aligned accurately with the pads on the circuit boards.

Figure 6:
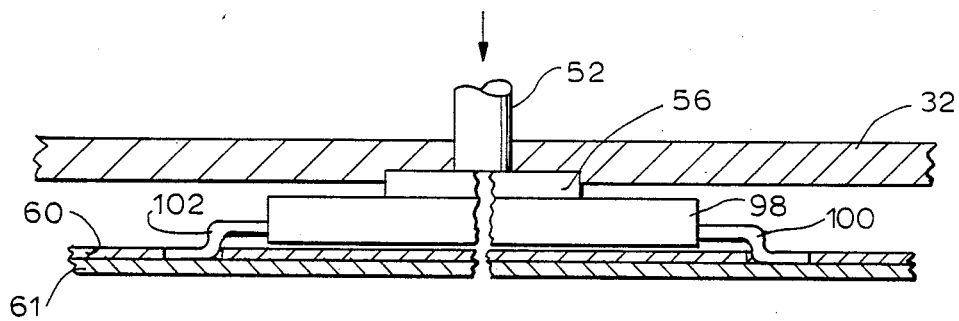

The next step in the process is shown in FIG. 6, in which a vacuum pick-up device 56 mounted on the plate 32 has been brought downwardly into contact with the top of the circuit device 98, and suction has been applied to attach the body of the circuit device 98 to the pick-up head.

Figure 7:
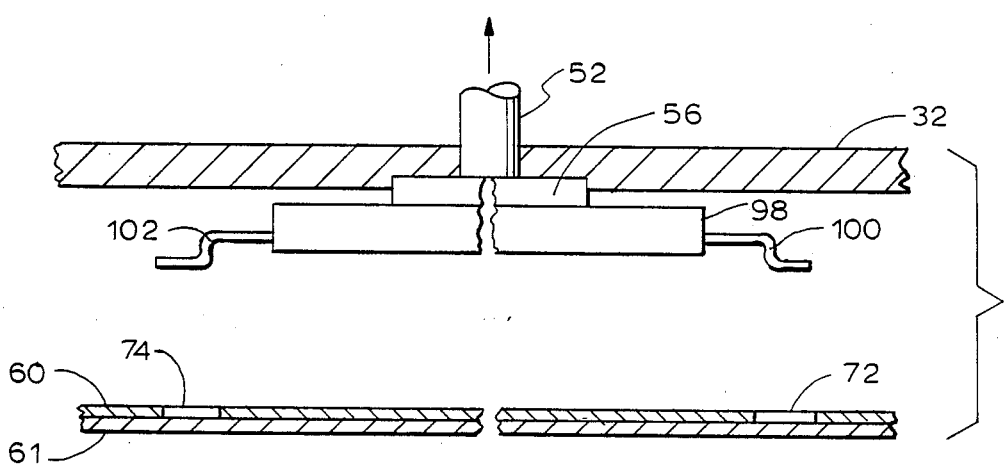

FIG. 7 shows the device 98 in its position during performance of the next step, in which the plate 32 is lifted, with the device 98 attached to the pick-up head 56.

For the sake of clarity, neither the base plate 22 or the circuit board 86 is shown in either of FIGS. 6 and 7.

Figure 8:
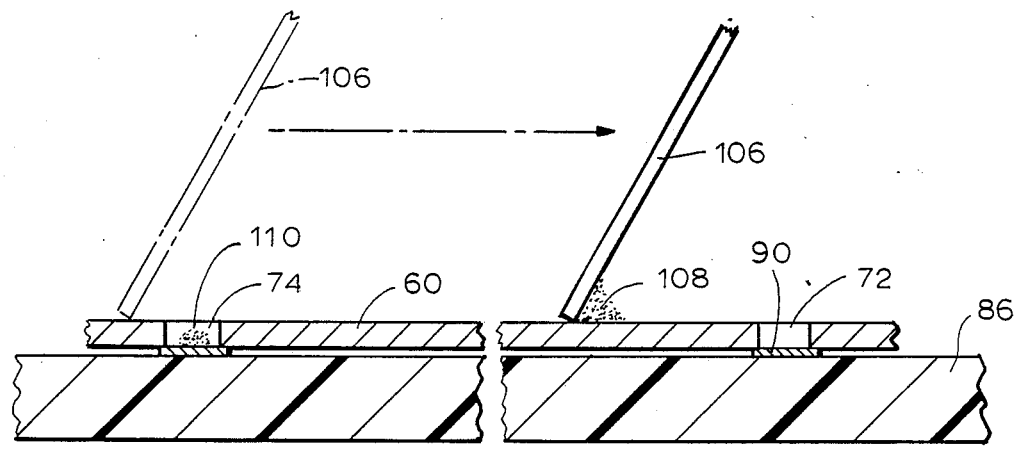

FIG. 8 illustrates schematically the process used to apply solder paste to the pads 88 and 90. A stencil or screen 60 like that used in this invention is located on the circuit board 86. A manual or automatic screen or stencil machine applies the paste. In principle, a spreader 106 scrapes a quantity 108 of solder paste across the surface of the stencil 88 and deposits a small quantity 110 of paste in each of the holes 72, 74.

Figure 9:
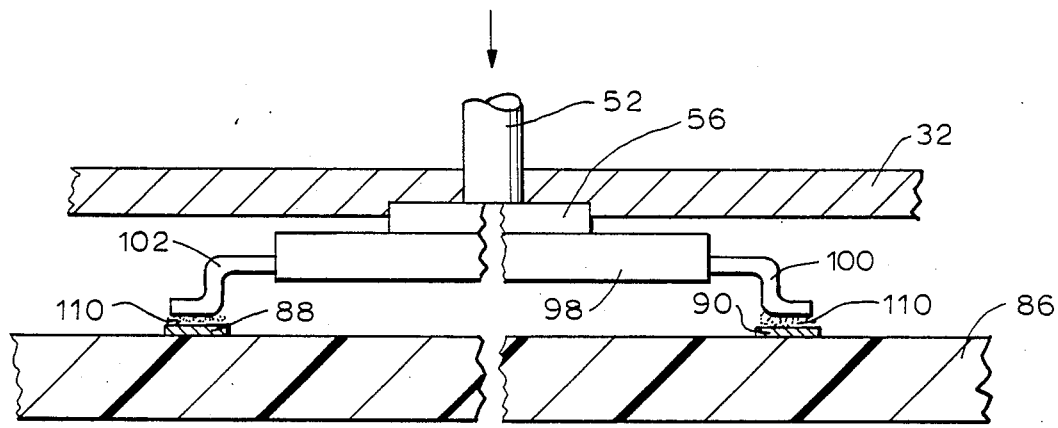

Now referring to FIG. 9, the circuit board 86 with quantities 110 of paste on the pads 88 and 90 is mounted in the device 20 of FIG. 1 on the pins 30. Then the plate 32 is lowered so as to bring the feet at the ends of the legs of the component 98 into contact with the pads 88 and 90. The appropriate amount of pressure is applied to the component by the pick-up head and placement sensing circuitry to properly seat the feet on the pads.

Figure 10:
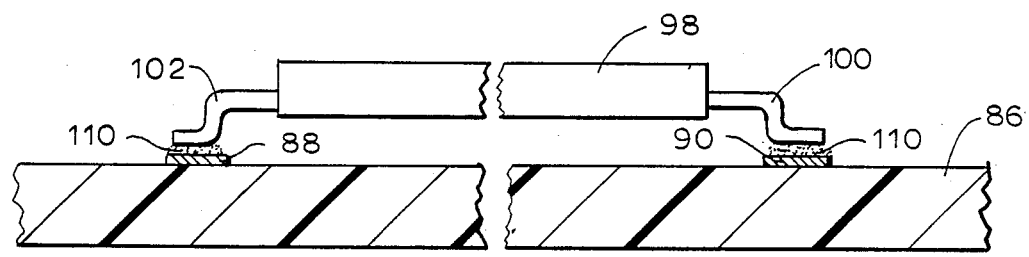

Next, as shown in FIG. 10, the vacuum on the pad 56 is removed, releasing the component 98, and the plate 32 is lifted. FIG. 10 shows the circuit board with the component mounted thereon, ready for reflow to melt the solder in the paste 110 and solder the feet to the circuit board pads.

FIG. 2 illustrates another embodiment of the invention. If it is preferred, a single hole 96 can be used instead of plural holes in order to accurately locate the feet of the component. The hole 96 is cut along the outer edges of the separate holes 72, 74. The hole 96 can be made of brass stencil sheet metal from modified artwork for the circuit board by photo-etching, or it can be a shallow-rectangular recess in a relatively thick backing plate. The recess can be formed by etching or a number of known precise machining techniques. The single alignment hole 96 may be easier to insert component feet into than multiple holes, and its accuracy can be entirely adequate.

The device 20 can be used to advantage in continuous production by using several of the combinations of stencil 60 and backing plate 61 as cartridges. Each cartridge can be loaded with circuit components, either by hand or by an automatic part delivery mechanism, and the loaded cartridges can be supplied to the device ready for mounting on the pins 30. (See FIG. X.) If an automatic part delivery mechanism is used, a vibrator can be provided to vibrate the parts after delivery to the pattern member to make certain the feet enter the holes in the pattern.

The thickness of the component feet typically is in the range of five to ten mils. The brass stencil material usually has about the same thickness. However, the pattern thickness can be varied as needed.

TWO-STATION EMBODIMENT

FIG. 11 shows the preferred two-station component placement device 120. Since many of the components of the device 120 are identical or similar to the corresponding components of the device 20 shown in FIG. 1, the same reference numerals have been used for the same parts in both figures of the drawings. As it is shown in FIG. 11, the base plate 22 is longer than that shown in FIG. 1. An aluminum metal frame 122 with a separate plate 124 mounted in the center replaces the solid plate 32 shown in FIG. 1. Instead of being mounted on the plate 22 itself, two of the locating pins 30 and the printed circuit board 121 are mounted at one end of a mounting plate 123 secured to a sliding plate or table 138. Mounted at the other end of the plate 123 on two more pins 30 is a pattern member 167 having two arrays 168 and 170 of holes 176, 178 and 172, 174.

The table 138 is mounted on bearings (not shown) to move along a pair of cylindrical rods 140 and 142 mounted above the surface of the base plate 22 by means of supports 146, 148, 150 and 152 located at opposite ends of the base plate 22. A rack 154 is attached to the undersurface of table 138 and mates with a pinion 156 which is driven by a servo motor 158 which is mounted on the vertical support member 26. Because of the greater length of the structure 120, there are six vertical posts 24 instead of the four shown in FIG. 1.

Secured to and extending from each end of the base plate 22 are brackets 160 and 164 which support micrometers 162 and 166, respectively. The ends of the micrometers are aligned with the edges 163 and 165', respectively, of the table 138 to serve as precisely adjustable end stops to stop the travel of the table very accurately. The micrometers are adjustable in increments of 1/10,000 inch, and have locks to hold the position of the end stop after it has been adjusted. The end of the micrometer is made of hardened steel, and the aluminum plate forming the table 138 has a hardened steel insert 165 at the point of contact with the micrometer to minimize change of the end stop position due to wear.

The printed circuit board 121 has mounting pads 66, 68, 72 and 74 which are located in a predetermined relationship with the holes in the arrays 168 and 170.

Two vacuum pick-up heads 128 and 130 are mounted on the plate 124 at locations such that they are directly above the arrays 168 and 170 when the table 138 is positioned all the way to the left against the end stop 166, and directly above the arrays 62 and 64 when the table is positioned against the end stop 162.

In operation, the device 120 performs as follows:

An operator places SMT integrated circuit components with their feet in the holes in the arrays 168 and 170. The motor 158 is operated to drive the table to a position so that the arrays 168 and 170 are immediately beneath the pick-up heads 128 and 130. Then, the motor 36 is operated to lower the frame 32 so that the pick-up heads 128 and 130 pick up the components located in the stencils by the application of a vacuum on the line 50. Then the frame 122 is raised while the table 138 is moved all the way to the right.

Pattern 167 has a backing plate with a height which is the same as the circuit board so that components are picked up and placed at the same elevation above the plate 123. When the table has moved all the way to the right-hand stop 162, the frame 122 is lowered by use of the motor 36, and the components are positioned on the pads in arrays 62, 64. The pads, of course, have solder paste on them so that the feet of the components adhere to the pads. Then, the vacuum on the line 50 is released, the frame 122 is raised, and the circuit board 122 is removed and replaced with another one, new components are located in the stencils 168 and 170, the table 138 is returned all the way to its left stop 166, and the process is repeated for the next board.

It should be understood that there are many other vacuum lines 132 exiting from the header 48 so that many different pick-up heads can be operated. Thus, dozens of components can be located on a single board simultaneously with the use of a separate pick-up head for each component, thus giving the device a "Mass Placement" capability. It is an advantageous feature of the invention that the vacuum pick-up heads need not be aligned very accurately with the components they pick up. All that is necessary is that the components be held securely after being picked up and until placement of the component is complete.

It also is an advantage that the pick-up heads move only vertically, rather than vertically and horizontally. This eliminates the need for complex numerical control programming required to guide the horizontal head movements, and eliminates the cumulative errors that can build up over many cycles of operation of such devices. The precise mechanical end-stops for the table 138 of FIG. 11, and the use of standard precise locating holes on the circuit boards and pattern members avoids such error.

It also is an advantage that all of the pick-up devices can be operated simultaneously so that only one vertical pick up or placement movement is required. This is faster and simpler than devices in which plural pick-up heads operate in sequence.

The electrical circuitry, position detectors and associated apparatus to operate the servo motors and time the application and release of vacuum to the heads is not disclosed because it is conventional and well known in the art.

It should be noted that the surfaces which support the circuit boards or pattern members should be flat to a high degree of accuracy, and should be very smooth. The frames and base plates of the various embodiments preferably are made of aluminum, but parts subject to wear, such as guide rods, etc., or parts subject to great stress are made of hardened steel.

It should be evident that the invention is not limited in its usefulness to use with gull-wing-shaped component leads. "J"-shaped leads can be used too, with pattern members having holes shaped to fit snugly against the vertical portions of the "J"-shaped legs. A pattern member which is deeper and wider in one dimension than the mounting pads is preferred for such devices. Similarly, modified pattern members can be used to align other mounting legs or feet for use in accordance with the present invention.

It can be seen that the invention admirably meets the objectives stated above. The device and method used relatively simple and inexpensive components and procedures to align the feet or important circuit connection interface of the electrical components accurately with mounting pads on surface-mount printed circuit boards. The invention results in large quantities of high quality boards being produced with minimal losses due to inaccurate placement of components, even with components having feet spaced only a few thousandths of an inch from one another. Thus, the alignment problem has been solved or alleviated in a relatively simple and inexpensive manner.

While the present invention has been particularly shown and described with reference to preferred embodiments, various changes and modifications in form and details may be made without departing from the spirit and scope of the invention. It is intended that the appended claims be interpreted as including the foregoing as well as various other changes and modifications.

We claim:

1. A device for accurately placing at least one electrical circuit component having at least one mounting foot serving as an electrical lead on a printed circuit board having at least one conductive pad thereon, said pad having an outer peripheral outline with said foot accurately aligned with and contacting said pad with the foot within the outer peripheral outline of the pad, said device comprising, in combination, a printed circuit board support member for accurately locating and supporting a printed circuit board in a pre-determined location, said printed circuit board having conductive mounting pads thereon in a pre-determined array matching that of mounting feet on an electrical circuit component to be mounted on said pads, each pad having an outer peripheral outline, a solder stencil having holes therethrough in a pre-determined array matching that of said mounting pads with each hold also defining the position of said foot, each said hole in said pattern member being dimensioned with an inner peripheral outline which corresponds to the outer peripheral outline of said pad to receive said foot therein with relatively close tolerances and thereby position said electrical circuit component in a pre-determined location relative to said pad with each foot in attaching contact within the outer peripheral outline of said pad, placement means for separating said electrical circuit component and said stencil from one another while maintaining a pre-determined relationship between the locations of said component and said pad, and for bringing said component foot and said pad together in contact with one another with said foot in attaching contact within the outer peripheral outline of said pad.

2. A device as in claim 1 in which each of said pads has a surface bearing a contact adhesive solder paste so that said feet adhere to said pads when brought into contact therewith.

3. A device as in claim 1 in which said placement means comprises means for lifting said component to separate said component from said pattern member, and lowering said component onto said pads while accurately maintaining the orientation of said component.

4. A device as in claim 1 in which said pattern member has a plurality of said holes, one for each of said feet.

5. A device as in claim 3 in which said placement means includes a vacuum pick-up device for selectively forming a temporary suction attachment to said component and then releasing said component.

6. A device as in claim 5 including a plurality of vacuum pick-up heads, one for each component to be mounted, and means for raising and lowering said heads simultaneously.

7. A device as in claim 1 in which said printed circuit board support member has a flat surface and includes a plurality of locating or tooling pins extending outwardly from said flat surface, said circuit board and said pattern member each having locating holes to receive said pins and locate said board on said surface, said placement means comprising means for lifting said component away from said pattern means to allow removal of said pattern means from said surface, and lowering said component in the same location.

8. A device as in claim 1 including a pattern support member spaced from said board support member, said pattern member being located on said pattern support member, said placement means including means for removing said component from said pattern member transporting said component and said circuit board relative to one another and placing said component foot on said pad while maintaining the orientation of said component established by said pattern member.

9. As device as in claim 8 in which said placement means comprises a vacuum pick-up head, means for moving said head vertically upwardly, for moving said circuit board to a location underneath said pick-up head, and for moving said pick-up head downwardly to contact said component foot with said pad.

10. A method of accurately positioning electrical circuit components having mounting feet on printed circuit boards having mounting pads arranged in an array matching the array of feet on said component, each pad having an outer peripheral outline, said method comprising the steps of:
(a) providing a solder stencil having holes therethrough in a pre-determined array matching the array of said mounting pads with at least one hold matching the array of pads on said circuit board and having an inner peripheral outline which corresponds to the outer peripheral outline of said pad,
(b) orienting said stencil in a pre-determined relationship with said array of pads,
(c) orienting said component by placing at least one of said feet of said component in said hole so that said foot falls within the inner peripheral outline of said hole, and
(d) contacting said pads and said feet with one another while maintaining said orientation of said component.

11. A method as in claim 10 including the step of separating said component and said pattern member from one another while maintaining said orientation of said component.

12. A method as in claim 10 in which said pattern member has a plurality of said holes arranged in an array matching that of said pads, there being one such hole for every foot to be mounted on a pad, said orienting step comprising inserting said feet into said holes.

13. A method as in claim 10 including the step of applying an adhesive solder paste to each of said pads prior to bringing said pads and feet into contact with one another, and including the step of heating said solder paste to solder said feet to said pads.

14. A method as in claim 11 in which said separating step comprises utilizing a vacuum pick-up and placement device to pick up said component to separate it from said pattern member, and place said component on said pads while maintaining the orientation of said component established by the aforesaid component orienting step.

15. A method as in claim 14 in which said separating step comprises laterally moving said vacuum pick-up device and said pattern member relative to one another after said component has been picked up and before said component is placed on said pads.

16. A method as in claim 10 in which said pattern providing step comprises utilizing the same or existing photographic artwork used for forming said pads to form a plurality of said holes by photo-etching, there being one hole for each of said feet.

17. A method as in claim 10 including the steps of providing a support member with a flat surface and locating pins,
providing locating holes in said pattern member and said circuit board, the locations of said locating holes matching those of said locating pins,
said pattern orienting step comprising placing said pattern member on said flat surface with said pins in said locating holes, said separating step comprising lifting said component away from said pattern member, removing said pattern member from said surface,
placing said circuit board on said surface with said pins in the holes in said board, said contacting step comprising lowering said component onto said circuit board.

18. A method as in claim 17 including the step of coating said pads with adhesive solder paste and epoxy before placing said circuit board on said surface.

19. A method as in claim 15 in which said lateral movement step comprises moving said pattern member between a first location in which said feet of said component are engaged within the inner peripheral outline of said holes of said pattern member and a second location laterally spaced from said first location.

20. A device for placing electrical circuit components accurately on surface-mount pads on printed circuit boards,
said device comprising, in combination, at least one support member having spaced apart surface areas, one for supporting printed circuit boards, and the other for supporting a solder stencil, said stencil having least holes matching the pattern of a group of said mounting pads on said printed circuit board, each hole having an inner peripheral outline which corresponds to the outer peripheral outline of a corresponding mounting pad, and
motive means for separating from one another said stencil and a component located with at least one of its contact feet in said hole within the inner peripheral outline of said hole, and for moving said component and said one surface area relative to one another to bring said at least one foot of said component into contact with said pad with the foot within the outer peripheral outline of the pad.

21. A device as in claim 20 in which said motive means includes drive means for moving said support member. laterally back and forth to bring said one area and said other area to an operating station in alternating sequence,
pick-up means at said operating station to pick up circuit components from said other area and place them down in said one area, and limit means for limiting the movement of said support member at each end of its travel.

22. A device as in claim 21 in which said pick-up means comprises a vertically movable member supporting at least one vacuum pick-up head, and controllable vacuum means for selectively applying and removing a vacuum source to said pick-up head.

23. A device as in claim 22 including a plurality of said pick-up heads, one for each component to be mounted.

24. A device for placing electrical circuit components accurately on surface-mount pads on printed circuit boards, said device comprising, in combination,
at least one support member having spaced apart surface areas, one for supporting printed circuit boards, and the other for supporting a component alignment pattern member, said pattern member having at least one hole matching the pattern of a group of said mounting pads on said printed circuit board, and motive means for separating from one another said pattern member and a component located with its contact feet in said hole, and for moving said component and said one surface area relative to one another to bring said feet of said component into contact with said pads, said motive means including drive means for moving said support member laterally back and forth to bring said one area and said other area to an operating station in alternating sequence, pick-up means at said operating station to pick up circuit components from said other area and place them down in said one area, and limit means for limiting movement of said support member at each end of its travel, said limit means including at least one micrometer adjustable to determine the stopping point of said support member.

25. A device for placing electrical circuit components accurately on surface-mount pads on printed circuit boards, said device comprising, in combination, at least one support member having spaced apart surface areas, one for supporting printed circuit boards, and the other for supporting a component alignment pattern member, said pattern member having at least one hole matching the pattern of a group of said mounting pads on said printed circuit board, and motive means for separating from one another said pattern member and a component located with its contact feet in said hole, and for moving said component and said one surface area relative to one another to bring said feet of said component into contact with said pads, said motive means including drive means for moving said support member laterally back and forth to bring said one area and said other area to an operating station in alternating sequence, pick-up means at said operating station to pick up circuit components from said other area and place them down in said one area, and limit means for limiting the movement of said support member at each end of its travel, said pick-up means a vertically movable member supporting at least one vacuum pick-up head, and controllable vacuum means for selectively applying and removing a vacuum source to said pick-up head, said device further including a base plate, an erect lifting frame secured to said base plate and extending above it, a plurality of vertical guide rods extending from said base plate, said vertically movable member comprising a pick-up head support mounted to slide on said vertical guide rods, a plurality of horizontal guide rods mounted on said base plate, said support member being mounted to slide on said horizontal guide rods, said pick-up means including further drive means mounted on said lifting frame for raising and lowering said vertically movable member, said limit means including two micrometers, one at each end of said support means to provide adjustable end stops.

26. A device for accurately locating electrical circuit components on conductive surface-mount pads on a circuit board, said circuit components having legs with pads at the end thereof, said pads on said legs being shaped to match said pads on said board, said device comprising, in combination, a board support member with locating means for locating said board accurately thereon, vacuum pick-up means mounted on said support member to pick up a component from adjacent said support member, lift said component vertically, and lower said component vertically, and means for locating a solder stencil on said support member with a pattern of holes matching said pads on said board and with said holes aligned vertically with said pads, each hole having an inner peripheral outline which corresponds to the outer peripheral outline of its matching pad.

27. A method as in claim 26 in which said aligning step includes the steps of locating said board and said pattern member at laterally spaced positions on a support, said mounting step including picking up said component from said pattern member and transferring it to said board.

* * * * *